United States Patent [19]
Holmstrand

[11] Patent Number: 4,589,926
[45] Date of Patent: May 20, 1986

[54] METHOD AND COMPACT MACHINE FOR TREATING PRINTED CIRCUIT CARDS

[75] Inventor: Rune H. Holmstrand, Vålberg, Sweden

[73] Assignee: AB Holmstrands Platindustri, Vålberg, Sweden

[21] Appl. No.: 613,597

[22] Filed: May 23, 1984

[30] Foreign Application Priority Data

Jun. 17, 1983 [SE] Sweden ................. 8303475

[51] Int. Cl.⁴ ............................. B01D 3/00
[52] U.S. Cl. ........................... 134/6; 15/302; 134/12; 134/25.4; 134/30; 134/32; 134/72; 134/109
[58] Field of Search ............... 134/6, 9, 12, 25.4, 134/25.5, 30, 32, 72, 109; 15/302, 306 B, 308, 21 D, 77

[56] References Cited

U.S. PATENT DOCUMENTS

| 3,079,286 | 2/1963 | Kearney et al. | 134/12 |
| 3,123,083 | 3/1964 | Kearney et al. | 134/11 X |
| 3,144,872 | 8/1964 | Kearney | 134/12 X |
| 3,292,194 | 12/1966 | Randall | 15/77 |
| 3,566,429 | 9/1971 | Hamilton | 15/77 |
| 3,928,064 | 12/1975 | Holm | 15/77 X |
| 3,946,454 | 3/1976 | Holm et al. | 15/77 |
| 4,210,461 | 7/1980 | Moree et al. | 134/11 |
| 4,322,251 | 3/1982 | Elliott | 134/11 |
| 4,353,323 | 10/1982 | Koblenzer | 134/11 X |
| 4,354,292 | 10/1982 | Telestad et al. | 15/77 |
| 4,390,396 | 6/1983 | Koblenzer | 134/12 X |
| 4,391,016 | 7/1983 | Kawamura et al. | 15/77 X |
| 4,475,259 | 10/1984 | Ishii et al. | 15/77 X |

Primary Examiner—Richard V. Fisher
Assistant Examiner—Sharon T. Cohen

[57] ABSTRACT

In order to remove impurities from one surface of printed circuit cards which have been subjected in a seperate step to a soldering operation using fluxing agent the invention suggests a method and compact machine for treating the cards. The method comprises the steps of feeding the printed circuit cards through the machine along a horizontal track and carrying out the treatment in a treating chamber having a plurality of successive treating zones comprising a washing and brushing zone for removing impurities from the lower surface of the printed circuit cards by the action of brushes and liquid solvent, and a subsequent drying zone in which the printed circuit cards are subjected to a hot air flow to remove solvent therefrom, and returning solvent used in the treating chamber to a distiller means mounted in the machine for vaporization and condensation of said solvent in order to obtain pure solvent which is supplied to said washing and brushing zone in a closed cycle.

12 Claims, 2 Drawing Figures

METHOD AND COMPACT MACHINE FOR TREATING PRINTED CIRCUIT CARDS

The present invention relates to improvements in a method of treating printed circuit cards in a compact machine in order to remove impurities from one surface of the printed circuit cards which have been subjected in a separate step to a soldering operation using fluxing agent, and to a compact machine for carrying out the method.

It is generally known to treat printed circuit cards with solvents in order to remove impurities from the cards and then dry the cards with air. The treatment is carried out in a machine which has external connections to a pump for blowing an air stream into the machine and external connections to a cleaning apparatus usually including a carbon filter in order to clean and recover solvents from the air which is exhausted from the machine. However, the consumption of solvent and discharge of solvent to the surroundings are objectionable as is the machine environment. Furthermore, Swedish patent application No. 8106080-8 and European patent application No. 0071907 describe methods of cleaning a gas stream from solvents, this cleaning being carried out at a place outside the machine in which the gas stream is entraining solvents.

The object of the present invention is to provide a novel method and compact machine for treating printed circuit cards, to reduce the solvent consumption when treating printed circuit cards, to improve the environment around the machine by greatly reducing the release of solvent, and to eliminate special equipment arranged outside the machine with carbon filters and connections for cleaning air from the machine containing solvent and distilling used solvent.

It is a further object to greatly reduce the external energy requirement of the machine.

According to the invention the method comprises the steps of feeding the printed circuit cards through the machine along a horizontal transport track and carrying out said treatment in a treating chamber having a plurality of successive treating zones comprising a washing and brushing zone for removing impurities from the lower surface of the printed circuit cards by the action of brushes and liquid solvent, and a subsequent drying zone in which the printed circuit cards are subjected to a hot air flow to remove solvent therefrom, and returning the solvent used in the treating chamber to a distiller means mounted in the machine for vaporization and condensation of said solvent in order to obtain pure solvent which is supplied to said washing and brushing zone in a closed cycle.

The compact machine according to the invention comprises a horizontal transport track, a treating chamber having a plurality of successive treating zones comprising a washing and brushing zone for removing impurities from the lower surface of the printed circuit cards by the action of brushes and liquid solvent, and a subsequent drying zone in which the printed circuit cards are subjected to a hot air flow to remove solvent therefrom, a blower means arranged in the drying zone to direct said air flow towards the printed circuit cards, and a distiller means mounted in the machine and comprising a tank for solvent which has been used in said treating chamber, a heating element to vaporize the solvent in the tank, and a cooling element to condense the vaporized solvent to produce a pure solvent which is supplied to said washing and brushing zone in a closed cycle.

The invention will be described further in the following with reference to the accompanying drawings.

Figure 1:
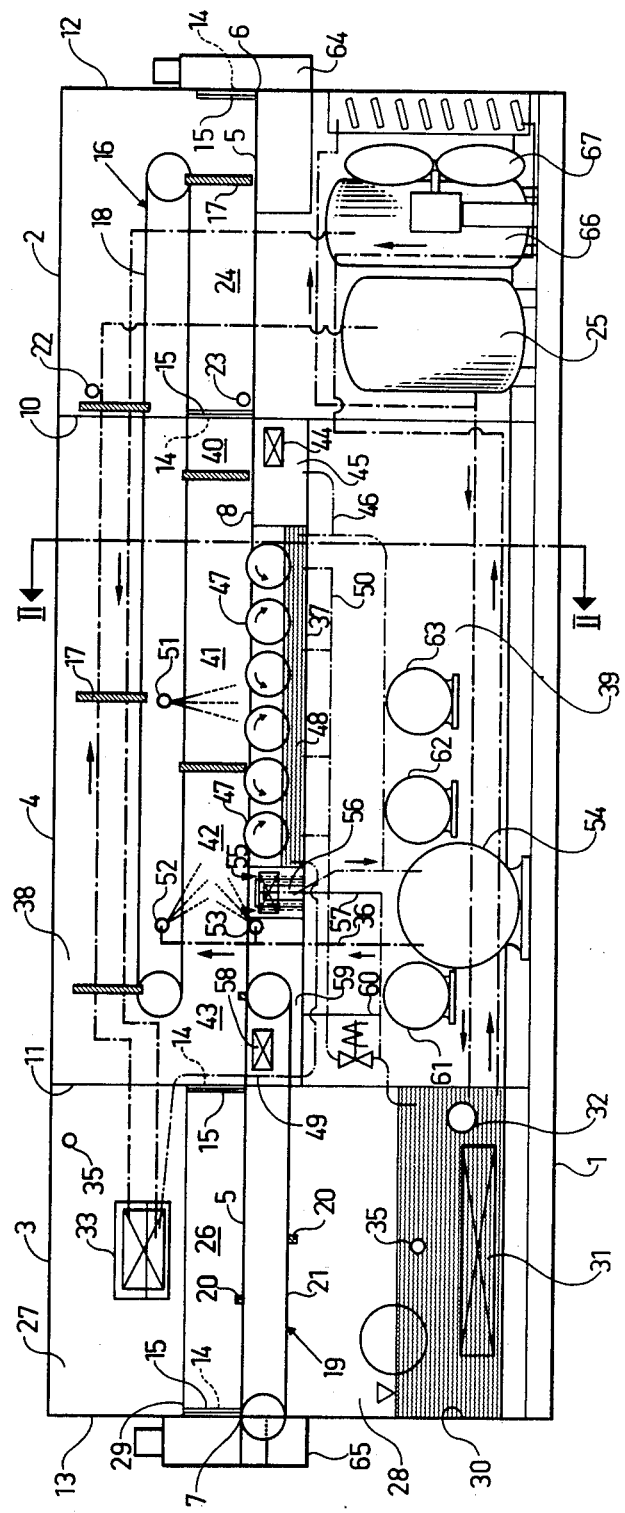
FIG. 1 shows from the longitudinal side, with the front portions removed, a machine for treating printed circuit cards in accordance with the invention.
Figure 2:
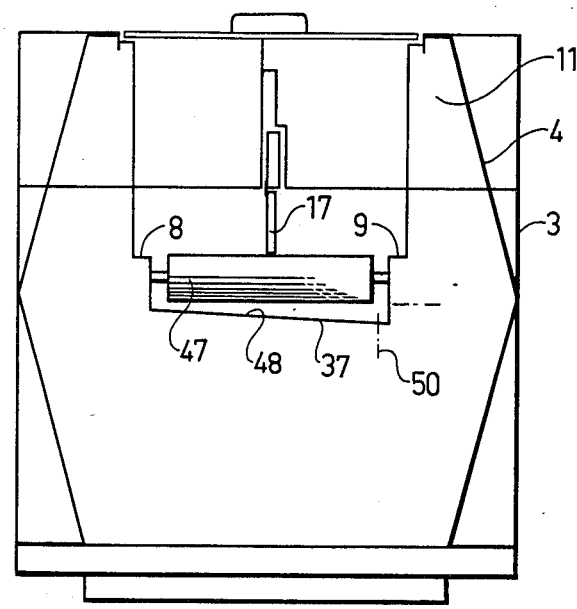
FIG. 2 is a cross section along the line II—II in FIG. 1.

The machine shown in FIG. 1 comprises an elongate housing 1, which comprises two end sections 2, 3 facing away from each other and an intermediate main section 4. A horizontal transport track 5 extends through the machine from its inlet end 6 to its outlet end 7. The transport track comprises two parallel slide bars 8, 9, spaced from each other to support the edges of cassettes during transport through the machine. Contrary to previously known apparatuses, the machine according to the invention requires very small spaces in installation in that all essential equipments are mounted inside the housing 1, i.e. the machine is compact.

The three sections are separated from each other by vertical, transverse partitions 10, 11 which, like the end walls 12, 13, are provided with rectangular openings 14 of sufficient size to permit the cassettes to pass freely. To prevent volatile solvent from flowing out of the machine and from the main section 4 to the end sections 2, 3, said openings are covered by flexible screens 15, preferably consisting of thick brushes of natural hair, for instance, easily bent aside by the cassettes as they pass through the opening 14.

The transport track 5 also comprises a transport device having a first, upper portion 16 with a plurality of uniformly distributed pin-like pushers 17 which, in transport position, hang down from a rotating belt 18, the free ends of the pushers 17 abutting the rear edge of a cassette and thus pushing it along on the slide bars 8, 9. Seen in the feed direction, in the end of the main section 4 the transport track 5 continuous with a second, lower portion 19 with a plurality of uniformly distributed pin-like pushers 20 which, in transport position, are directed upwardly from a rotating belt 21 in order to push along a cassette delivered by the first transport track portion. Suitable transport means are connected to the ends of the machine to supply it with cassettes at the inlet end 6 and to remove them at the outlet end 7.

To control various functions a pusher senser 22 and a cassette senser 23 are provided in the upstream end section 2. In conjunction with the transport track this end section 2 is provided with a buffer zone 24, one of its functions being to reduce the solvent losses. Various other components, such as a cooling compressor or refrigerator 25, are arranged in the lower space of the end section.

The downstream end section 3 is provided with a transport zone 26 in conjunction with the transport track, this zone itself also functioning as a buffer zone and being separated from the upper and lower spaces 27, 28 of the end section by suitable separating means 29. The two spaces, however, communicate with each other. A distiller is also arranged in the end section 3, comprising a tank 30 in the lower space 28, for solvent which is to be distilled. During operation, the solvent is heated by a heat-exchanger 31 served by the heat generated by the compressor 25, an immersion heater 32 being arranged to heat the solvent during start-up of the machine. The vaporized solvent rises to the upper space 27 in the end section 3 where there is a cooler 33 which condenses the solvent to produce pure solvent.

The equipment described, comprising heat-exchanger 31, heater 32 and cooler 33, thus forms a distiller which is built into the machine. The temperatures are regulated by thermostats 35. At the bottom of the distillation tank 30 is a cleaning door (not shown) to enable simple removal of accumulated sludge and the like.

In conjunction with the transport track 5, the main section 4 is provided with a horizontal, trough-like partition 37 which divides the main section into an upper space 38 and a lower space 39, said spaces being completely separated from each other. The upper space 38 forms the actual treating chamber of the machine in that it comprises a first cooling zone 40, a washing and brushing zone 41, a drying zone 42, and a second cooling zone 43.

The first cooling zone 40 includes a cooler 44 arranged to condense solvent from the air in the vicinity of the partition 10 between this cooling zone 40 and the adjacent buffer zone 24, with the purpose of reducing the escape of solvent from the machine. The solvent condensed is collected in a container 45 formed by the trough-like partition 37 and is returned to the distillation tank 30 through a pipe 46.

The subsequent washing and brushing zone 41 comprises six horizontal, cylindrical brushes 47, journalled in the same plane and extending transversely across the transport track 5. The brushes are arranged to rotate in different directions as indicated in FIG. 1. They are mounted in a washing container 48 filled with solvent to a level allowing the brushes to be wet by solvent during their rotation. Pure solvent is supplied from the distillation cooler 33 to the washing container 48 through a pipe 49 connected to the downstream end of the container. Used, impure solvent is carried to the distillation tank 30 via a pipe 50 connected to the upstream end of the container. Above the transport track 5 in the washing and brushing zone 41 there is also a spray nozzle 51 for rinsing from above for cleaning only cassettes, i.e. without printed circuit cards.

The subsequent drying zone 42 comprises upper and lower blowing nozzles 52, 53 blowing out hot air to remove the solvent from the treated cards. The hot air is generated by an air compressor 54 which takes its air from inside the machine, more specifically from the treating chamber 38, through a suction inlet 55 arranged therein, the solvent in the air being separated out upon passage through a cooler 56 so that the air compressor 54 is supplied with air, increased in temperature in the compressor to preferably 0°-10° C. above the boiling point of the solvent, freed from solvent, and this air is then blown out in the drying zone 42 in an internal cycle 36. The solvent condensed out from the air drawn into the cooler 56 is carried to the distillation tank 30 through a pipe 57.

The following second cooling zone 43 includes a cooler 58 for condensing solvent out from the air in the vicinity of the partition 11 between this cooling zone 43 and the adjacent transport zone 26 in the same way as in the first cooling zone 40, with the purpose of reducing the release of solvent from the machine. The condensed solvent is collected in a container 59 formed by the trough-like partition 37 and returned to the distillation tank 30 through a pipe 60.

In the lower space of the main section, besides said air compressor 54, there are a drive motor 61 for the transport device 16, 19, a pump 62, and a drive motor 63 for the brushes 47.

At the inlet and outlet ends 6, 7 there are suction ramps 64, 65 mounted in such a way that they do not draw air directly out of the machine but instead take care of any solvent which may escape the machine, thus constantly ensuring a favourable working environment around the machine.

The treatment in the washing and brushing zone 41 is carried out with a cold solvent of the type of carbon fluoride 113, e.g. Arklone ®, which has a boiling point of 45° C., in combination with multi-step brushing in order to remove impurities and fluxing agent from the lower side of the printed circuit cards after they have been subjected to a soldering operation using fluxing agent. In the washing container 48 in the washing and brushing zone 41, the solvent flows in the opposite direction to the feed direction of the cards and they will therefore be cleaned during passage with solvent of increasing purity.

The described arrangement with circulating air between the treating chamber and the air compressor 54, via a cooler 56 thus means that no external air need be supplied for the drying operation.

As is clear from the description above, the machine must be cooled and heated, which is achieved by means of a heat-pump system including said heat-exchanger 31, cooler 33, compressor 25 and a tank 66. This arrangement enables the energy consumption to be halved in comparison with separate cooling and heating systems. The heat pump is thus a cooling machine where the cold side is used to cool solvent to liquid form after distillation. The heat generated in the cooling process is used to maintain the distillation process. The electric element 32 used to start the distillation process quickly after an extended stop in production, is automatically disconnected when the heat-pump can manage distillation on its own. Excess heat is removed by a fan 67.

The machine according to the invention thus provides a compact washing, air-treating and recovery arrangement with built-in distiller for continuous recovery of used solvent in a closed cycle, internal air circulation in a closed cycle for drying purposes and a built-in heat-pump system, for cleaning printed circuit cards passing through the machine, the cards being supported by cassettes moved along by the pin-shaped pushers 17, 20. According to a modification of the machine the heat-pump system is not utilized, however, the machine still provides a compact washing, air-treating and recovery arrangement.

What I claim is:

1. A method of dispensing printed circuit cards in a compact machine for removing impurities from a surface of the printed cards subjected in a separate step to a soldering operation using a fluxing agent, said machine having an inlet and an outlet end section and an intermediate section having upper and lower, separated from one another, spaces, the upper of which defines a treating chamber having a plurality of successive treating zones comprising at least a washing and brushing zone, for removing impurities from the lower surface of the printed circuit cards by the action of brushes and cold solvent, and a subsequent drying zone in which the printed circuit cards are subjected to hot air flow for removing solvent therefrom, said method comprising feeding the cards through the machine sections along a horizontal transport track from the machine inlet end section to and through the machine outlet end section, providing a first closed loop within said intermediate and outlet sections for recycling solvent used in the treating chamber and containing impurities removed from the cards and collected in a trough means in the upper space of the intermediate section, said solvent with impurities therein being passed from an upstream end of the trough means to distiller means in the outlet end section of the machine for vaporizing and condensing the vaporized solvent, condensed cold solvent, substantially free of impurities, being returned to the downstream side of the trough means in the treating chamber; providing a second closed loop path in the intermediate section for said hot air flow for removing solvent from solvent wetted cards as they pass along said track through said intermediate section, said second path including a cooling means and blower means in the upper space of the intermediate section and an air compressor in the lower space thereof, solvent contained in the air being condensed in the cooling means and passed to said distiller means while the air freed of solvent is fed to said air compressor to heat the air between 0°–10° C. above the boiling point of the solvent, and supplying the thus heated air to said blower means for discharge unto the solvent wetted cards; and providing a third closed loop for distilling solvent and comprising said distiller means including a heat exchanger in a solvent tank in a lower space of the outlet end section for vaporizing solvent therein and a cooler in an upper space of the outlet end section for condensing the vaporized solvent.

2. The method according to claim 1, wherein solvent in the air at openings through which the printed circuit cards pass into and out of the treating chamber is condensed by cooling means in cooling zones intermediate both said inlet and intermediate sections and said outlet and intermediate sections.

3. The method of claim 2, wherein all the steps of the process are carried out within the confines of said machine.

4. A compact machine for cleansing printed circuit cards to remove impurities from one surface of said cards which have been subjected in a separate step to a soldering operation using fluxing agents, comprising an inlet and an outlet end section and an intermediate section therebetween and having upper and lower, separated from one another, spaces, the upper of which defines a treating chamber having a plurality of successive treating zones comprising at least a washing and brushing zone for removing impurities from the cards, and a drying zone wherein the cards are subjected to hot air flow, a horizontal transport track extending through said machine sections, a first means in the intermediate and outlet end sections of the machine for recycling solvent and comprising distiller means for vaporizing solvent and for condensing the solvent thus vaporized and including trough means in the treating chamber, said trough means having an upstream and a downstream end, solvent with impurities therein in the upstream end of the trough means supplied to the distiller means for vaporization and condensation, cold condensed vaporized solvent being supplied to the downstream end of the trough means; second means in the intermediate section of the machine for circulating hot air in a closed loop and comprising a cooling means, blower means and an air compressor, said second means being effective to separate solvent in the air from the air by said cooling means, the separated solvent being supplied to said distiller means, the air stripped of the solvent being heated by said air compressor and supplied to said blower means for blowing said heated air onto solvent wetted cards as they move along said track; and third means, including said distiller means comprising heating means in a solvent tank and a cooler, for supplying heat values to the heating means produced on cooling solvent to liquid form and including for this purpose a solvent compressor at the inlet section of the machine.

5. The machine of claim 4, wherein cooling means are provided close to openings in the machine through which printed circuit cards pass into and out of said treating chamber to form cooling zones to condense solvent from the air to prevent solvent from escaping in gaseous form through said openings.

6. The machine of claim 4, wherein said heating means comprises a heat-exchanger.

7. The machine of claim 5, wherein said openings for the cards are provided in partitions dividing said inlet end, outlet end and intermediate sections, said openings being covered by flexible screens which are bent aside when a card passes said screens.

8. The machine of claim 4, wherein said trough means comprises a trough-like partition which divides said intermediate section into said upper and lower spaces, said outlet end section also being provided with upper and lower spaces communicating with each other, said solvent tank being in the lower space and said cooler in the upper space, and an intermediate transport zone aligned with the horizontal transport track and being separated from the last-mentioned spaces by separating means.

9. The machine according to claim 4, wherein each card is supported by a cassette carrying the card along the transport track in a horizontal plane.

10. The machine according to claim 4, wherein the machine has a housing, all parts of the machine being within said housing.

11. The machine of claim 4, wherein said distiller means and said solvent compressor of the third means forms a heat pump system for heating and cooling of said heating means and cooler, respectively, said distiller means being located in the outlet end section and said solvent compressor in the inlet end section of the machine.

12. A method according to claim 1, wherein a heat pump system is provided including said heat exchanger in the solvent tank and cooler and further including a compressor in the inlet end section of the machine for cooling solvent to liquid form after distillation, and supplying the heat thus generated to said heat exchanger in the solvent tank for said vaporization of the solvent.

* * * * *